US010460902B2

(12) United States Patent
Nakayama

(10) Patent No.: US 10,460,902 B2
(45) Date of Patent: Oct. 29, 2019

(54) CHARGED PARTICLE BEAM WRITING APPARATUS AND METHOD FOR DIAGNOSING FAILURE OF BLANKING CIRCUIT

(71) Applicant: NuFlare Technology, Inc., Yokohama-shi (JP)

(72) Inventor: Takahito Nakayama, Chigasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/129,408

(22) Filed: Sep. 12, 2018

(65) Prior Publication Data

US 2019/0080877 A1 Mar. 14, 2019

(30) Foreign Application Priority Data

Sep. 13, 2017 (JP) .................. 2017-175848

(51) Int. Cl.
*H01J 37/04* (2006.01)
*H01J 37/317* (2006.01)
*H01J 37/24* (2006.01)
*H01J 37/304* (2006.01)
*H01J 37/10* (2006.01)
*H01J 37/20* (2006.01)

(52) U.S. Cl.
CPC ............ *H01J 37/045* (2013.01); *H01J 37/10* (2013.01); *H01J 37/20* (2013.01); *H01J 37/24* (2013.01); *H01J 37/3045* (2013.01); *H01J 37/3174* (2013.01); *H01J 2237/0492* (2013.01); *H01J 2237/24592* (2013.01)

(58) Field of Classification Search
CPC .......... H01J 37/045; H01J 37/10; H01J 37/20; H01J 37/24; H01J 37/3045; H01J 37/3174
See application file for complete search history.

(56) References Cited

U.S. PATENT DOCUMENTS

2014/0203185 A1* 7/2014 Nakayama .......... H01J 37/3174
250/397
2016/0061876 A1* 3/2016 Yamashita ............ H01J 37/045
324/511
2016/0233052 A1* 8/2016 Hirose ................ H01J 37/3174

FOREIGN PATENT DOCUMENTS

JP 2004-111708 4/2004
JP 2007-67192 3/2007
(Continued)

Primary Examiner — Eliza W Osenbaugh-Stewart
(74) Attorney, Agent, or Firm — Oblon, McClelland, Maier & Neustadt, L.L.P.

(57) ABSTRACT

In one embodiment, a charged particle beam writing apparatus includes a blanking circuit applying a blanking voltage to a blanking deflector, a stage on which a substrate is placed, a mark on the stage, a detector detecting an irradiation position of the charged particle beam based on irradiation of the mark with the charged particle beam, and a diagnostic electric circuitry that causes the charged particle beam to enter a predetermined defocused state relative to the mark, obtains a difference between a first irradiation position when the mark is scanned under first irradiation conditions and a second irradiation position when the mark is scanned under second irradiation conditions in which at least either of irradiation time and settling time in the first irradiation conditions is varied, and determines occurrence of a failure of the blanking circuit when the difference is a predetermined value or more.

9 Claims, 3 Drawing Sheets

Normal

Error

(56) References Cited

FOREIGN PATENT DOCUMENTS

| JP | 2012-44051 | 3/2012 |
| JP | 2012-109482 | 6/2012 |
| JP | 2013-51229 | 3/2013 |
| JP | 2014-138175 | 7/2014 |

\* cited by examiner

Normal

Error

CHARGED PARTICLE BEAM WRITING APPARATUS AND METHOD FOR DIAGNOSING FAILURE OF BLANKING CIRCUIT

CROSS REFERENCE TO RELATED APPLICATION

This application is based upon and claims benefit of priority from the Japanese Patent Application No. 2017-175848, filed on Sep. 13, 2017, the entire contents of which are incorporated herein by reference.

FIELD

The present invention relates to a charged particle beam writing apparatus and a method for diagnosing failure of blanking circuit.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

An electron beam writing apparatus performs writing by causing a deflector to deflect an electron beam. The role of beam deflection by using the deflector includes adjusting the shape and/or size of a beam shot, adjusting a shot position, and blanking control for switching between a beam ON state and a beam OFF state.

When a blanking voltage applied to a blanking deflector is at a first predetermined value (e.g., 5 V), an electron beam is deflected such that the whole of the beam is blocked by a blanking aperture member, and thus enters the beam OFF state. When the blanking voltage is at a second predetermined value (e.g., 0 V), the beam passes through an aperture of the blanking aperture member, and thus enters the beam ON state.

A blanking circuit for applying a voltage to the blanking deflector includes an analog circuit, such as digital-to-analog converter (DAC) amplifier. If a fault occurs in the analog circuit, the blanking voltage will fail to be set at a predetermined value, causing an error. An error in blanking voltage leads to an insufficient dose or the tilt of the axis of a beam, resulting in a reduction in writing accuracy. The detection of faults in analog circuits is often delayed. For example, such a fault may fail to be detected in an electron beam writing apparatus, and may be identified during inspection of patterned masks for defects or in the next or following process (e.g., wafer processing) after several weeks. In such a case, a large number of defective masks would be produced before identification of the fault.

An insufficient dose causes the dimensions of a write pattern to change. Whether a fault has occurred in the blanking circuit can be determined based on the pattern dimensions. However, a similar change in pattern dimensions is caused by a failure of a shaping deflection circuit for adjusting the size of a beam shot. It is therefore difficult to determine the occurrence of a fault in the blanking circuit.

DETAILED DESCRIPTION

In one embodiment, a charged particle beam writing apparatus includes an emitter emitting a charged particle beam, a blanking deflector performing blanking control of the charged particle beam by deflecting the beam in accordance with an applied blanking voltage, a blanking circuit applying the blanking voltage to the blanking deflector, a stage on which a substrate irradiated with the charged particle beam is placed, a mark on the stage, a detector detecting an irradiation position of the charged particle beam based on irradiation of the mark with the charged particle beam, and a diagnostic electric circuitry that causes the charged particle beam to enter a predetermined defocused state relative to the mark, obtains a difference between a first irradiation position detected by the detector when the mark is scanned with the charged particle beam under first irradiation conditions and a second irradiation position detected by the detector when the mark is scanned with the charged particle beam under second irradiation conditions in which at least either of irradiation time and settling time in the first irradiation conditions is varied, and determines occurrence of a failure of the blanking circuit when the difference is a predetermined value or more.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
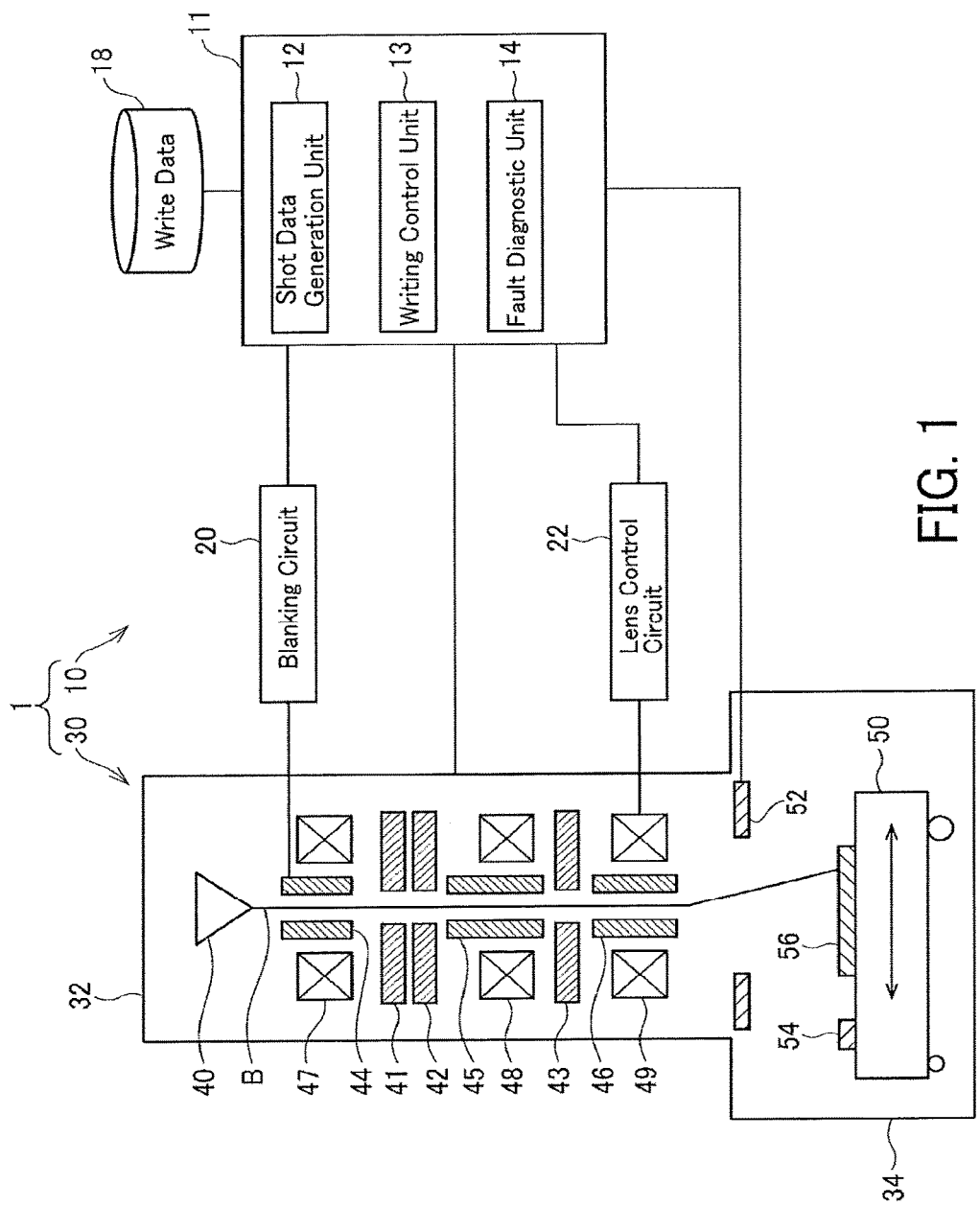
FIG. 1 is a schematic diagram of an electron beam writing apparatus according to an embodiment of the present invention.

FIG. 1 is a schematic diagram of an electron beam writing apparatus according to an embodiment of the present invention. A writing apparatus 1 illustrated in FIG. 1 is a variable-shaping type writing apparatus including a writing unit 30 that applies an electron beam to a writing target substrate 56 to write a desired pattern on the substrate and a controller 10 that controls an operation of the writing unit 30.

The writing unit 30 includes an electron optical column 32 and a writing chamber 34. The electron optical column 32 accommodates an electron gun 40, a blanking aperture member 41, a first shaping aperture member 42, a second shaping aperture member 43, a blanking deflector 44, a shaping deflector 45, an objective deflector 46, an illumination lens 47, a projection lens 48, and an objective lens 49. The objective lens 49 is a dynamic focusing lens capable of adjusting a focal point position in the Z-axis direction.

The writing chamber 34 accommodates a stage 50, which is movably disposed. The stage 50 is movable in the X direction and the Y direction that are orthogonal to each other in the horizontal plane. The substrate 56 is placed on the stage 50. Examples of the substrate 56 include exposure masks used to fabricate semiconductor devices, mask blanks, and semiconductor substrates (silicon wafers) on which semiconductor devices are to be fabricated. The stage 50 has thereon a mark 54. The mark 54 is cross-shaped or dot-shaped, and includes a silicon substrate and heavy metal, such as tantalum or tungsten, on the silicon substrate.

An irradiation position detector 52 that detects an irradiation position (beam position) of an electron beam B on the basis of irradiation of the mark 54 with the electron beam B is disposed above the stage 50. Examples of the irradiation position detector 52 usable herein include an electron detector that detects, as a current, electrons reflected from the mark 54 scanned by the electron beam B. Information about the detected beam position is sent to a fault diagnostic unit 14 of a control computer 11, which will be described later.

The controller 10 includes the control computer 11, a storage device 18, a blanking circuit 20, and a lens control circuit 22. The control computer 11 includes a shot data generation unit 12, a writing control unit 13, and the fault diagnostic unit 14. Data input to and output from the respective units of the control computer 11 and data used and obtained during calculation are stored to a memory (not illustrated) as appropriate.

These units of the control computer 11 may be implemented by hardware or software. If the units are implemented by software, a program that achieves at least part of functions of the units may be stored in a recording medium, such as a CD-ROM, and a computer including electric circuitry may be caused to read and execute the program.

The storage device 18 (storage unit) stores write data, which is obtained by converting layout data containing design figure patterns into a format that can be input to the writing apparatus 1.

The shot data generation unit 12 reads the write data from the storage device 18, and performs multi-stage data conversion on the write data to generate shot data specific to the apparatus. In the shot data, for example, the kind of figure, the size of the figure, an irradiation position, and irradiation time are defined. The writing control unit 13 controls or causes the writing unit 30 on the basis of the shot data to perform a writing process.

The blanking circuit 20 converts a digital blanking signal output from the control computer 11 into an analog signal, amplifies the signal, and applies a blanking voltage based on the amplified signal to the blanking deflector 44. The blanking voltage is used to perform blanking deflection of an electron beam, or switching between a beam ON state and a beam OFF state, thus controlling irradiation time (shot time) for each shot.

The lens control circuit 22 controls exciting current of the objective lens 49 to adjust the focus position of the electron beam B.

FIG. 1 illustrates the components necessary for description of the embodiment. The writing apparatus 1 may include other normally necessary components.

The electron beam B emitted from the electron gun 40 in the electron optical column 32 passes through the blanking deflector 44, which causes the electron beam in the beam ON state to pass through the blanking aperture member 41 and deflects the electron beam in the beam OFF state such that the whole of the beam is blocked by the blanking aperture member 41. The electron beam B passing through the blanking aperture member 41 for a period between the time when the beam OFF state is switched to the beam ON state and the time when the beam ON state is switched to the beam OFF state corresponds to a one-time electron beam shot.

Figure 2:
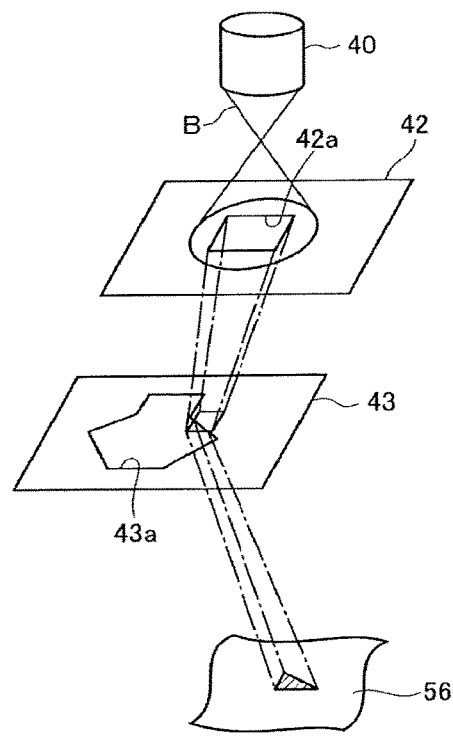
FIG. 2 is a diagram explaining variable shaping of an electron beam.

The illumination lens 47 causes the electron beam B of each shot, generated by allowing the beam to pass through the blanking deflector 44 and the blanking aperture member 41, to be applied to the first shaping aperture member 42 having a rectangular aperture 42a (refer to FIG. 2). The electron beam B passes through the aperture 42a of the first shaping aperture member 42, so that the electron beam is shaped into a rectangle.

The electron beam that has passed through the first shaping aperture member 42 and serves as a first shaped aperture image is projected onto the second shaping aperture member 43 through the projection lens 48. The shaping deflector 45 adjusts the position of the first aperture image on the second shaping aperture member 43, so that the electron beam passing through an aperture 43a of the second shaping aperture member 43 can be changed in shape and dimension (or subjected to variable shaping).

The electron beam that has passed through the second shaping aperture member 43 is focused by the objective lens 49, deflected by the objective deflector 46, and then applied to a desired position on the substrate 56 on the stage 50.

Figure 3A:
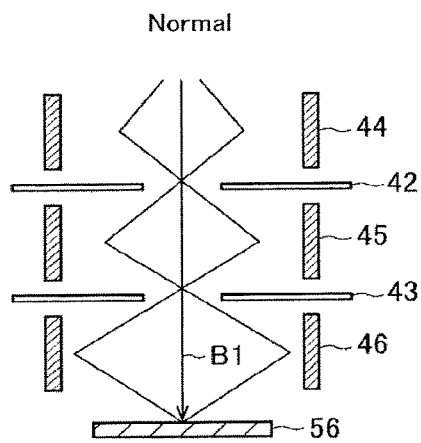
FIG. 3A is a diagram illustrating a normal beam path and FIG. 3B is a diagram illustrating a beam path under conditions where a blanking voltage has an error.
Figure 3B:
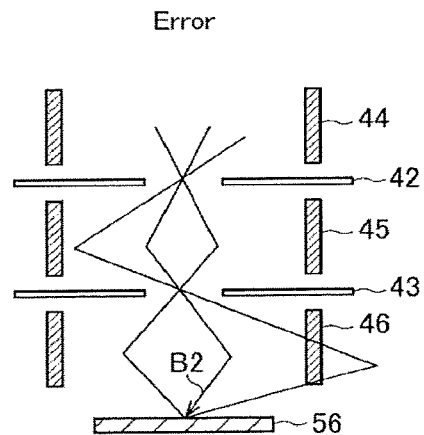

When the blanking voltage applied to the blanking deflector 44 in the beam ON state is at a normal value (e.g., 0 V), a beam B1 is applied (substantially) perpendicular to the substrate 56 as illustrated in FIG. 3A. In contrast, a failure or fault in analog part of the blanking circuit 20 causes an error in the blanking voltage, leading to the tilt of the beam axis of a beam B2 as illustrated in FIG. 3B.

Figure 4:
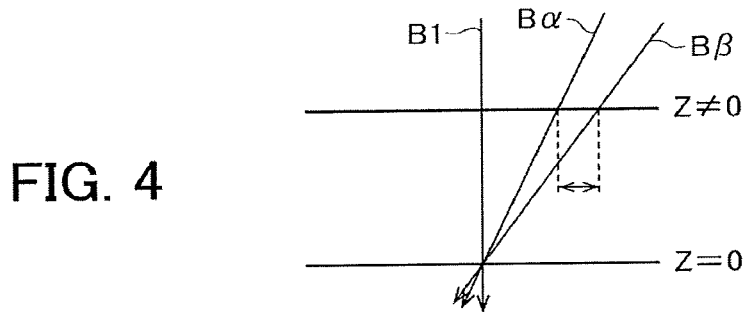
FIG. 4 is a diagram illustrating examples of beam paths.

As illustrated in FIG. 4, beams impinge at the same position on the surface (Z=0) of the substrate 56, on which the beams are focused, irrespective of the presence or absence of the tilt of the beam axis. A failure of the blanking circuit 20 fails to be detected based on the beam position. However, when a beam is defocused (Z≠0), the position of the beam varies depending on the presence or absence of the tilt of the beam axis. Furthermore, a difference in blanking voltage leads to a difference in the tilt of the beam axis, resulting in a change in the beam position. FIG. 4 illustrates a beam $B_\alpha$ obtained at a blanking voltage α and a beam $B_\beta$ obtained at a blanking voltage 13.

Under conditions where there is a failure of the blanking circuit 20, a change in irradiation time ratio (=shot time/(shot time+settling time)) leads to a change in error of the blanking voltage. In the present embodiment, the positions of defocused beams are measured under different conditions obtained by varying the irradiation time ratio. When the difference between the beam positions is a predetermined value or more, it is determined that there is a failure of the blanking circuit 20.

Figure 5:
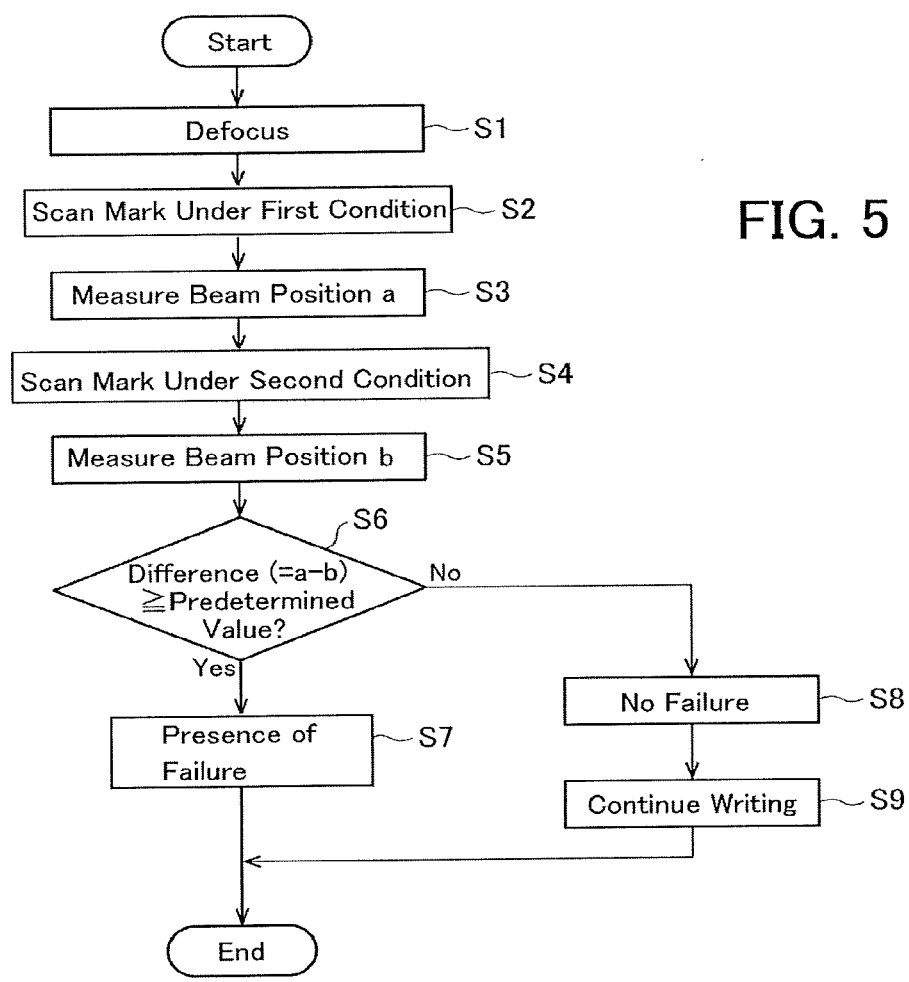
FIG. 5 is a flowchart explaining a method for diagnosing a failure of a blanking circuit in accordance with the embodiment.

A method for diagnosing a failure of the blanking circuit 20 will now be described with reference to a flowchart of FIG. 5. The failure diagnosis is periodically performed during the writing process. Examples of various factors causing a failure of the blanking circuit 20 include a fault in a DAC amplifier and the occurrence of contact resistance.

The focal point position of the objective lens 49 is shifted and is set to a position different from the surface of the mark 54 (step S1).

Irradiation conditions are varied, and the mark 54 is scanned with an electron beam. The irradiation conditions are varied by changing the ratio of the shot time (writing time) to the settling time. First, the mark 54 is scanned with the electron beam under first conditions, serving as the irradiation conditions (step S2). The first conditions include shot time of 400 ns and settling time of 400 ns. The irradiation position detector 52 detects reflected electrons to measure a beam position a (step S3).

The mark 54 is scanned with the electron beam under second conditions, serving as the irradiation conditions (step S4). The second conditions include shot time of 256 ns and settling time of 64 ns. The irradiation position detector 52 detects reflected electrons to measure a beam position b (step S5).

Although the ratio of the shot time to the settling time is varied in the present embodiment, the irradiation conditions can be varied by varying at least either of the shot time and the settling time.

The fault diagnostic unit 14 obtains the difference (error) between the beam position a and the beam position b. When the difference is the predetermined value or more (Yes in step S6), it means that the beam axis tilts, and the fault diagnostic unit 14 determines that there is a failure of the blanking circuit (step S7). The fault diagnostic unit 14 informs a user of the failure.

When the difference between the beam position a and the beam position b is less than the predetermined value (No in step S6), the fault diagnostic unit 14 determines that there is no failure of the blanking circuit (step S8). The focal point position of the objective lens 49 is adjusted to the same level as that of the surface of the substrate 56, and the writing process is continued or resumed (step S9).

According to the present embodiment as described above, the mark 54 is scanned with defocused electron beams under different irradiation conditions (irradiation time ratios) to obtain the difference between beam positions. Whether the beam axis tilts, or whether there is a failure of the blanking circuit 20, can be easily and rapidly determined based on the difference.

In the above-described embodiment, the focal point position of the objective lens 49 is shifted and the mark 54 is scanned. If the stage 50 is movable in the Z-axis direction (height direction of the stage), the level of the stage may be changed to provide a defocused state.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing apparatus comprising:
an emitter emitting a charged particle beam;
a blanking deflector performing blanking control of the charged particle beam by deflecting the beam in accordance with an applied blanking voltage;
a blanking circuit applying the blanking voltage to the blanking deflector;
a stage on which a substrate irradiated with the charged particle beam is placed;
a mark on the stage;
a detector detecting an irradiation position of the charged particle beam based on irradiation of the mark with the charged particle beam; and
a diagnostic electric circuitry that causes the charged particle beam to enter a predetermined defocused state relative to the mark, obtains a difference between a first irradiation position detected by the detector when the mark is scanned with the charged particle beam under first irradiation conditions and a second irradiation position detected by the detector when the mark is scanned with the charged particle beam under second irradiation conditions in which at least either of irradiation time and settling time in the first irradiation conditions is varied, and determines occurrence of a failure of the blanking circuit when the difference is a predetermined value or more.

2. The apparatus according to claim 1, further comprising:
a lens that adjusts a focal point position of the charged particle beam applied to the substrate or the mark.

3. The apparatus according to claim 1, wherein the first irradiation conditions differ from the second irradiation conditions in the ratio of the irradiation time to the settling time.

4. The apparatus according to claim 1, wherein the stage is moved in a height direction of the stage, thus causing the charged particle beam to enter the predetermined defocused state relative to the mark.

5. A method for diagnosing a failure of a blanking circuit, the method comprising:
applying a blanking voltage to a blanking deflector through the blanking circuit to perform blanking control for switching between an ON state and an OFF state of a charged particle beam;
causing the charged particle beam to enter a predetermined defocused state relative to a mark on a stage on which a writing target substrate is placed and scanning the mark with the charged particle beam under first irradiation conditions to detect a first irradiation position of the charged particle beam;
scanning the mark with the charged particle beam in the predetermined defocused state under second irradiation conditions, in which at least either of irradiation time and settling time in the first irradiation conditions is varied, to detect a second irradiation position of the charged particle beam;
obtaining a difference between the first irradiation position and the second irradiation position; and
determining occurrence of a failure of the blanking circuit when the difference is a predetermined value or more.

6. The method according to claim 5, wherein before the mark is scanned with the charged particle beam, a focal point position of the charged particle beam is changed by using an objective lens.

7. The method according to claim 5, wherein the first irradiation conditions differ from the second irradiation conditions in the ratio of the irradiation time to the settling time.

8. The method according to claim 5, wherein the stage is moved in a height direction of the stage, thus causing the charged particle beam to enter the predetermined defocused state relative to the mark.

9. The method according to claim 5,
wherein whether there is a failure of the blanking circuit is determined during a writing process, and
wherein when the difference is less than the predetermined value, it is determined that there is no failure of the blanking circuit, a focal point position of the charged particle beam is then adjusted to a level corresponding to the surface of the substrate, and the writing process is resumed.

* * * * *